United States Patent
Chai et al.

(10) Patent No.: US 10,453,603 B2
(45) Date of Patent: Oct. 22, 2019

(54) INTEGRATION OF INDUCTOR AND DAMPER FOR POWER FILTERS

(71) Applicant: HAMILTON SUNDSTRAND CORPORATION, Charlotte, NC (US)

(72) Inventors: Harry Chai, Caledonia, IL (US); Eric A. Carter, Monroe, WI (US); John Huss, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 657 days.

(21) Appl. No.: 15/194,657

(22) Filed: Jun. 28, 2016

(65) Prior Publication Data
US 2017/0372835 A1    Dec. 28, 2017

(51) Int. Cl.
| | |
|---|---|
| *H01F 27/40* | (2006.01) |
| *H03H 7/06* | (2006.01) |
| *H01C 3/06* | (2006.01) |
| *H01F 17/06* | (2006.01) |
| *H02M 1/12* | (2006.01) |

(52) U.S. Cl.
CPC ............ *H01F 27/40* (2013.01); *H01C 3/06* (2013.01); *H01F 17/062* (2013.01); *H03H 7/06* (2013.01); *H02M 1/126* (2013.01)

(58) Field of Classification Search
CPC ............ H01C 3/06; H01F 27/40; H03H 7/06
USPC ...................... 336/211; 333/172, 181, 185
See application file for complete search history.

(56) References Cited

U.S. PATENT DOCUMENTS

| | | |
|---|---|---|
| 7,068,005 B2 | 6/2006 | Baker |
| 7,091,704 B2 | 8/2006 | Chou et al. |
| 7,301,787 B2 | 11/2007 | Wu et al. |
| 9,300,197 B2 | 3/2016 | Maclennan |
| 2013/0039105 A1 | 2/2013 | Rozman et al. |
| 2013/0063855 A1 | 3/2013 | Smugala |

FOREIGN PATENT DOCUMENTS

| | | | |
|---|---|---|---|
| DE | 4402351 A1 | 8/1995 | |
| GB | 001493369 A | * 11/1977 | .............. G01B 7/16 |
| JP | S55135419 U | 9/1980 | |

OTHER PUBLICATIONS

European Search Report for EP Application No. 17178310.3 dated Feb. 15, 2018; 8 pages.

* cited by examiner

*Primary Examiner* — Rakesh B Patel
(74) *Attorney, Agent, or Firm* — Cantor Colburn LLP

(57) ABSTRACT

An inductor damper circuit includes a toroidal inductor having an inductor coil and an inductor housing, and a resistive element configured around a periphery of the inductor coil and having one end connected to the toroidal inductor, where the resistive element is printed on a flexible substrate and configured between the inductor coil and the inductor housing, and the resistive element is integrated with the toroidal inductor.

11 Claims, 6 Drawing Sheets

INTEGRATION OF INDUCTOR AND DAMPER FOR POWER FILTERS

BACKGROUND

The present disclosure relates to power filter circuits, and more specifically, to integration of an inductor and damper for a power filter circuit.

A basic building block of a power filter is a low pass filter including an inductor (L) and a capacitor (C). This filter can also contain a damper circuit including a capacitor and a damper resistor (R). Prior art damper resistors use off-the-shelf resistors that may be either thick film or metal foil resistors. Resistor failures have been the leading cause for failures of various motor controllers during production process. The prime causes of the resistor failures are due to fragile ceramic base and low pulse power capability of the resistor element.

Conventional wire wound resistors are generally large and bulky. The package style would require wire harness and supports that increase the production time and cost significantly, and also reduce overall reliability. It may be advantageous to integrate the resistor into the filter inductor package without changing its size. By integrating the resistor into inductor package the printed wiring assembly, component count and factory assembly time can be reduced, and the pulse power capability can also be increased by several order of magnitude hence improved reliability.

SUMMARY

According to an embodiment of the present invention, an inductor damper circuit includes a toroidal inductor having an inductor coil and an inductor housing, and a resistive element configured around a periphery of the inductor coil and having one end connected to the toroidal inductor. The resistive element is printed on a flexible substrate and configured to the inductor coil. The resistive element is integrated within the inductor housing with the toroidal inductor.

According to other embodiments, an inductor damper circuit includes a toroidal inductor having an inductor coil and an inductor housing; and a resistive element on a flexible insulating disk at a base of the inductor coil and having one end connected to the toroidal inductor. The resistive element is printed on a flexible substrate and configured between the inductor coil and the inductor housing. The resistive element is integrated within the inductor housing with the toroidal inductor.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Common electromagnetic interference (EMI) filters and harmonic filters topologies are shown in FIG. 1 through FIG. 4. They differ from each other in the type of damper circuits and locations of the damper circuits. For example resistor (R) in series with a capacitor ($C_d$) forms a damper circuit. In topology shown in FIG. 1, a damper circuit may be connected across the filter inductor (L), while in FIG. 2 it can be connected across the filter capacitor (C).

Figure 3:
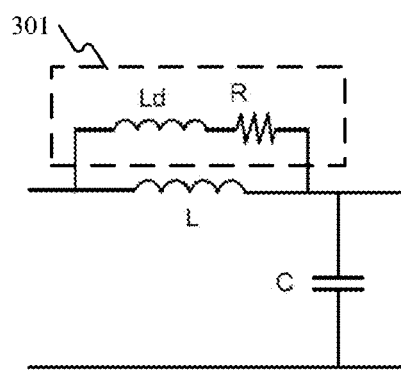
FIG. 3 depicts another filter circuit having an inductive damper connected across the filter inductor according to an embodiment.

Similarly, a resistor (R) in series with an inductor $L_d$ also forms a damper circuit. In FIG. 3, the resistor is configured across the filter inductor L, and in FIG. 4 it is across filter capacitor (C). According to some embodiments, and depending on application requirements, component $C_d$ or $L_d$ may be eliminated to have topologies shown in FIG. 5 and/or FIG. 6.

Figure 7A:
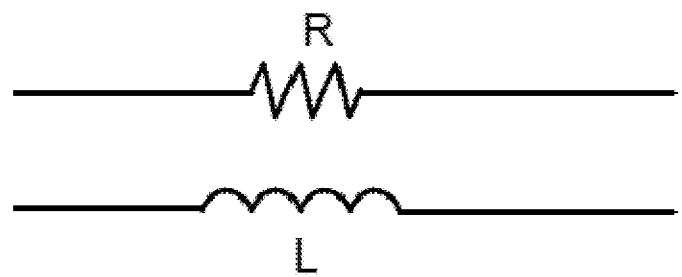
FIG. 7A depicts a terminal arrangement according to an embodiment.
Figure 7B:
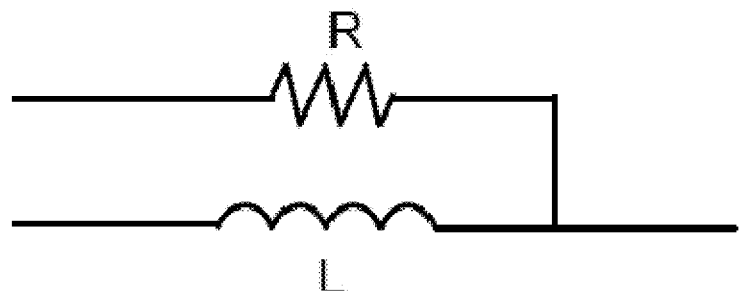
FIG. 7B depicts another conventional terminal arrangement according to an embodiment.

In all embodiments depicted herein, one end of the damper resistor may be connected to a terminal of the inductor. Therefore the combined damper resistor and inductor may have all four terminals brought out or have three terminals brought out, as depicted in FIGS. 7A and 7B.

Figure 9:
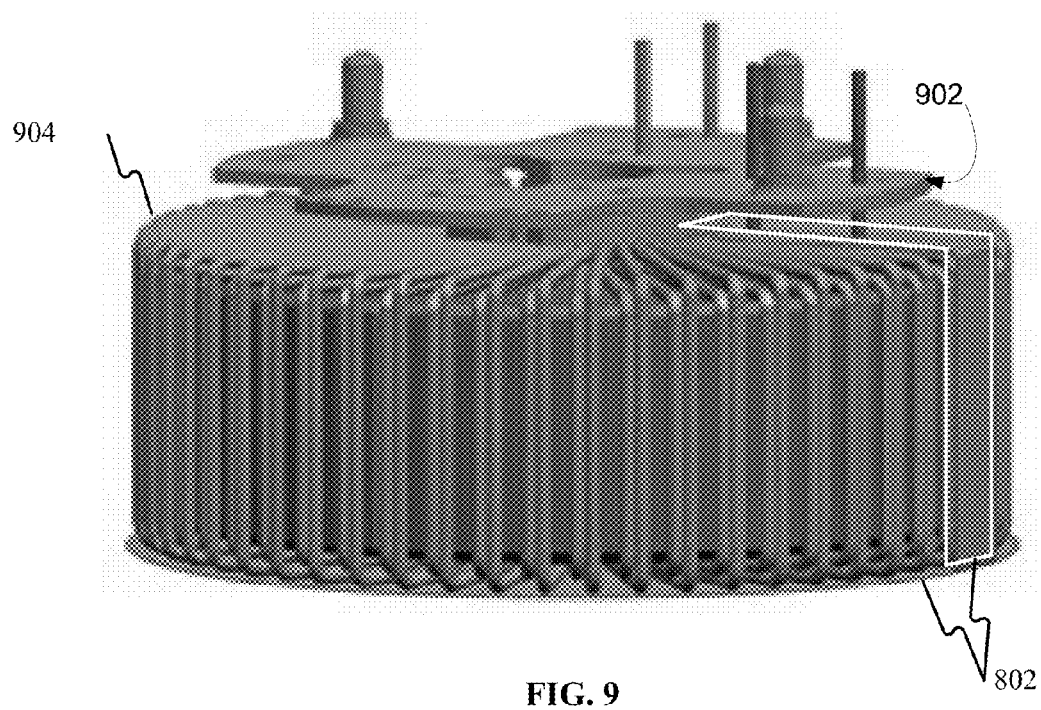
FIG. 9 depicts an exemplary resistive pattern printed on a flex disk and inserted between a toroidal inductor and a toroidal inductor housing, according to one embodiment.
Figure 10:
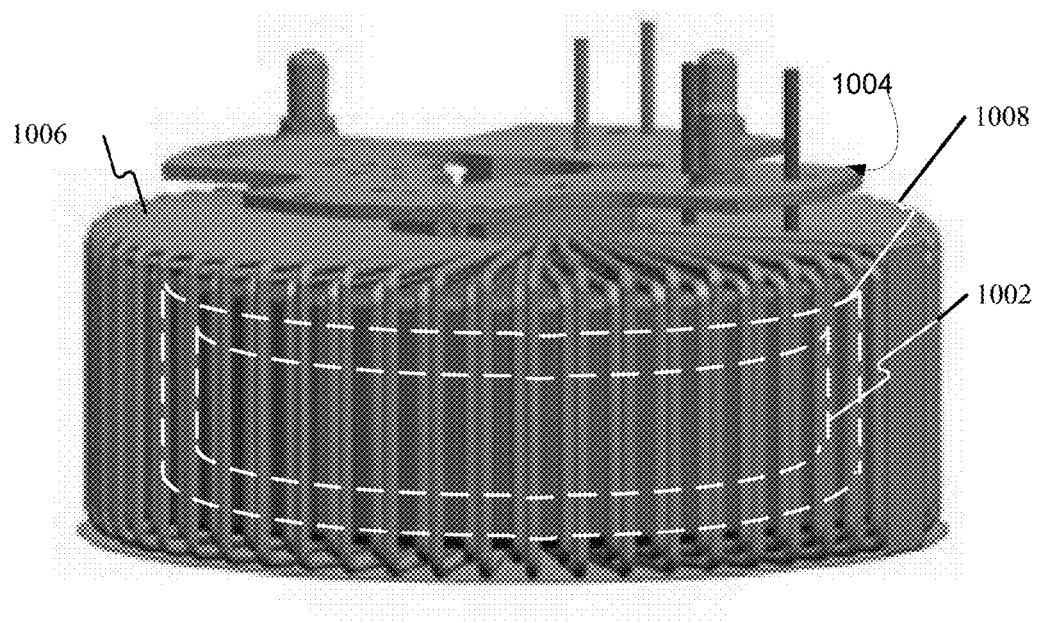
FIG. 10 depicts a resistive pattern printed on a strip-type resistor and inserted between a toroidal inductor and a toroidal inductor housing according to one embodiment.
Figure 11:
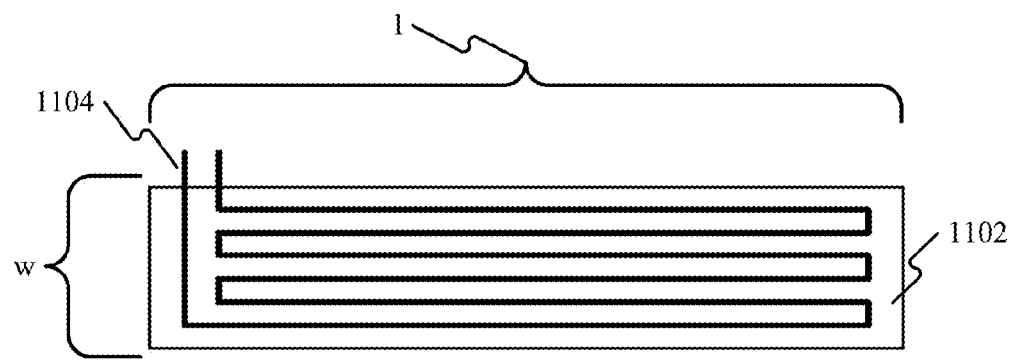
FIG. 11 depicts a resistive element pattern for a strip-type resistor according to one embodiment.
Figure 12:
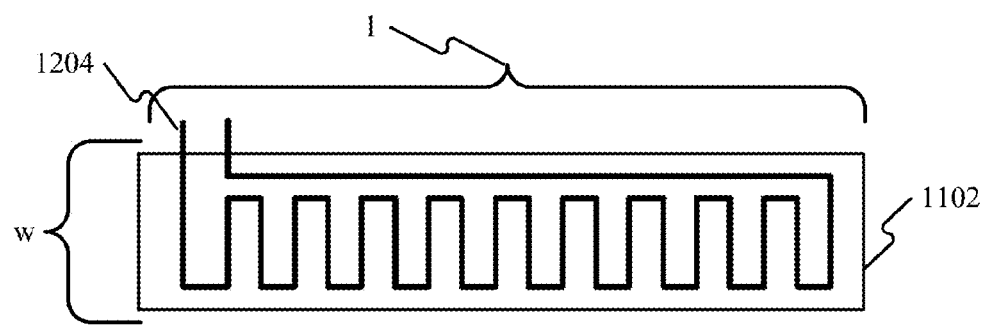
FIG. 12 depicts a resistive element pattern for a strip-type resistor according to one embodiment.

In one embodiment, the resistive pattern is printed on a flexible strip base substrate material and then wrapped around the toroid (as shown in FIG. 10), while in other embodiments, the resistive pattern is printed on a disk shaped flexible base material and inserted between the toroidal inductor and its housing (as shown in FIG. 9). The printed resistive pattern could be as shown in FIG. 11 or FIG. 12 for flexible strip and as FIG. 13 and FIG. 14 for a flexible disk.

Figure 1:
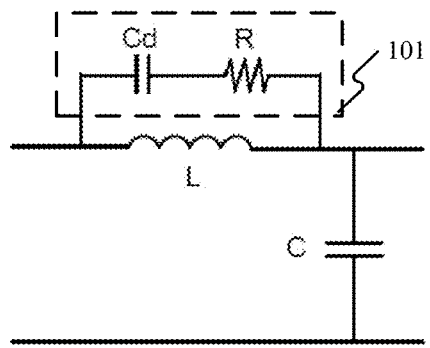
FIG. 1 depicts a filter circuit having an indicative damper connected across a filter inductor according to an embodiment.
Figure 2:
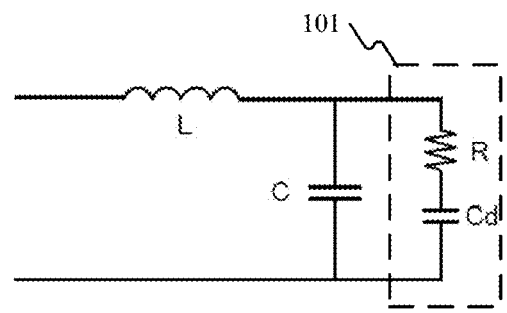
FIG. 2 depicts a filter circuit having a capacitive damper connected across a filter capacitor according to an embodiment.

Now, considering the figures in more detail, FIGS. 1 and 2 depict filter circuits. Dampers may use a resistor (R) and capacitor ($C_d$) in series to form the damper 101. The damper is connected either across a filter inductor (L), as shown in FIG. 1, or across the filter capacitor ($C_d$), as shown in FIG. 2. In conventional damper circuits, the resistor R used in the damper is often a conventional resistor, or a thick-film resistor. These off-the-shelf type conventional resistors have a low mass, hence a diminished capability to handle pulse power situations. With conventional resistors, circuit reliability and life may be compromised by the in-rush energy incurred during power up and other transient power situations.

Another common failure with conventional resistors arises from inherent weakness of the package and the internal construction of the package. To reduce the cost of the resistor, the resistor is often made using a ceramic substrate with the resistor element printed on the inside surface of the ceramic. The ceramic baseplate is exposed and is used in contact with a heat sink or heat spreader for thermal management. The ceramic base may be prone to cracking during assembly and component handling.

Figure 4:
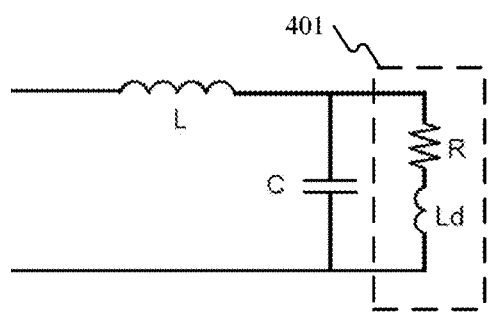
FIG. 4 depicts a circuit having an inductive damper connected across the filter capacitor according to an embodiment.

FIG. 3 depicts another filter circuit having an inductive damper 301 connected across a filter inductor (L). FIG. 4 depicts a conventional circuit having an inductive damper 401 connected across the filter capacitor ($C_d$). The filter inductor $L_d$, as shown in FIGS. 3 and 4, may be a toroidal-type inductor when used in aerospace applications due to its low volume and weight. The toroid is typically placed into a metal housing and encapsulated with thermally conductive material (a metal housing is shown with respect to FIG. 9). The metal housing provides a means for mechanical retention and thermal management.

Figure 5:
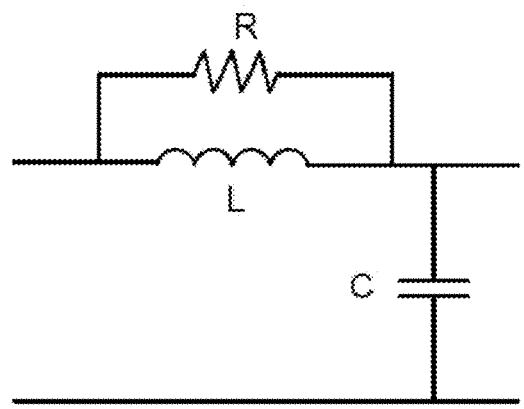
FIG. 5 depicts a simplified filter circuit having a damper resistor connected across a filter inductor according to an embodiment.
Figure 6:
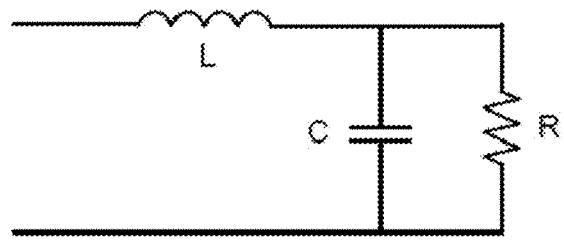
FIG. 6 depicts another simplified filter circuit having a damper resistor connected across a filter capacitor according to an embodiment.

Some filter circuit configurations may include a single resistive element (R), as shown in FIG. 5, which depicts a simplified filter circuit having a damper resistor (R) connected across a filter inductor (L). FIG. 6 depicts a simplified filter circuit having a damper resistor connected across a filter capacitor.

Depending on the filter circuit topology used, (as shown in conventional circuits depicted in FIGS. 1-6) the damper resistor ends could be brought out separately (as depicted in FIG. 7A) or one end of the resistor element may be connected to one of the inductor leads (as depicted in FIG. 7B).

Figure 8:
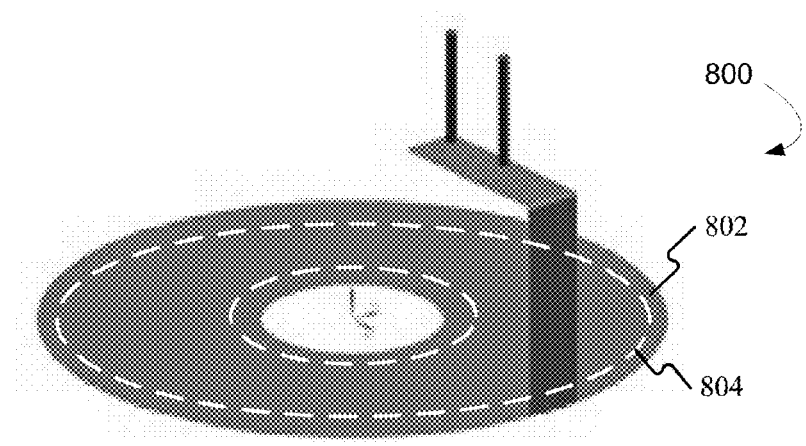
FIG. 8 depicts an exemplary resistive pattern printed on a flex disk according to an embodiment.

FIG. 8 depicts an exemplary resistive trace 804 printed on a flex disk 802, according to an embodiment. As shown in FIG. 8, resistive element 800 can include a resistive trace 804 (depicted as two dashed lines in FIG. 8 for simplicity, and shown in greater detail with respect to embodiments depicted in FIGS. 12 and 13). Flex disk 802 may be any circuit-printable substrate used for printing resistive circuits. Flex disk 802 may be flexible such that it is manipulatable around a periphery of an object.

For example, FIG. 9 depicts resistive trace 804 printed on a flex disk 802 (the edge of which depicted on the underside of a toroidal inductor housing 902). Flex disk 802 may be configured between toroidal inductor 904 and toroidal inductor housing 902, according to one embodiment. According to some embodiments, as shown in FIGS. 9 and 10, a resistive element may be printed on a substrate and either attached to an inner circumference of the inductor housing (as depicted in FIG. 9), or wrapped around the outer circumference of a wound toroid (as depicted in FIG. 10).

Referring again to FIG. 9, according to one embodiment, a resistive element may include a resistive trace pattern printed on a flexible insulating disk (substrate) and disposed between the bottom of toroidal inductor 902 and the housing 904.

FIG. 10 depicts a resistive pattern on 1002 (shown in greater detail with respect to FIGS. 11 and 12) on a substrate 1008. According to one embodiment, a resistive pattern 1002 may be printed on a substrate 1008 and inserted between a toroidal inductor 1004 (around an outer periphery of inductor 1004) between the inductor 1004 and a toroidal inductor housing 1006. Substrate 1008 may be any circuit-printable substrate used for printing resistive circuits. Substrate 1008 may be flexible such that it is manipulatable around a periphery of an object, such as toroidal inductor housing 1006.

FIG. 11 depicts a resistive element pattern for a strip-type resistor, according to one embodiment. As shown in FIG. 11, the flexible substrate 1102 forms a rectangle having a width (w) and a length (l) that is longer than the width, where the resistive trace 1104 begins at a first end of the substrate, and traverses along width w in a zig-zag pattern from the first end of the substrate (shown on the left side of the rectangle) to a second end of the substrate (the right side of the rectangle). In some embodiments, as shown in FIG. 11, the resistive trace 1104 terminates at the first end of the substrate near the entry point. Accordingly, the resistive trace 1104 traverses along the length l of the rectangle 6 times before terminating at the first end of the substrate.

According to other embodiments, the flexible substrate 1102 forms a rectangle having width w and length l that is longer than the width, where the resistive trace 1204 begins at a first end of the substrate (shown on the left of the rectangle) and traverses along the width w in a zig-zag pattern from the first end of the substrate (left of the rectangle) to a second end of the substrate (to the right of the rectangle). Resistive trace 1204 terminates at the first end of the substrate.

FIG. 12 depicts another resistive element pattern for a strip-type resistor, according to one embodiment. As shown in FIG. 12 the resistive element 1304 begins at a first point of a circumference of the flexible insulating disc and traverses a first half of the circumference in a first semi-circular zig-zag path, crosses to a second a second half of the circumference, and traverses the second half of the circumference in a second semi-circular zig-zag path. As shown in FIG. 12, the resistive element 1304 ends proximally to the first point of the circumference, where the second semi-circular zig-zag path is a mirror of the first semi-circular zig-zag path.

Figure 13:
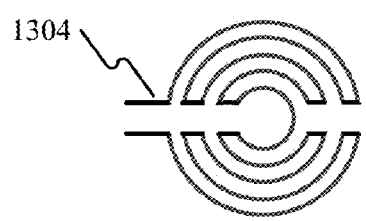
FIG. 13 depicts a resistive element pattern for a strip-type resistor according to one embodiment.
Figure 14:
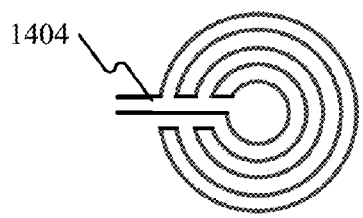
FIG. 14 depicts a resistive element pattern for a strip-type resistor according to one embodiment.

FIG. 13 depicts another resistive element pattern for a flexible disk-type resistor, according to one embodiment. As shown in FIG. 13, the resistive element 1304 begins at a first point of the circumference of the flexible insulating disc and traverses the whole circumference in a zig-zag path, wherein the resistive element ends proximal to the first point of the circumference.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An inductor damper circuit comprising:
a toroidal inductor having an inductor coil and an inductor housing; and
a resistive element configured around a periphery of the inductor coil and having one end connected to the toroidal inductor, wherein:

the resistive element is printed on a flexible substrate and electrically connected to the inductor coil; and the resistive element is integrated within the inductor housing with the toroidal inductor;

wherein the flexible substrate forms a strip-type resistor having a resistive trace printed thereupon and is disposed between an outer periphery of the inductor coil and an inner periphery of the inductor housing; and wherein the flexible substrate forms a rectangle having a width and a length that is longer than the width, wherein the resistive trace begins at a first end of the substrate and traverses along the length in a zig-zag pattern to a second end of the substrate, wherein the resistive trace terminates at the first end of the substrate.

2. The inductor damper circuit of claim 1, wherein the resistive element includes a pair of resistor ends terminating separately from a pair of inductor ends.

3. The inductor damper circuit of claim 1, wherein the resistive element includes a pair of resistor ends, where one resistor end from the pair of resistor ends is co-terminal with one inductor end of a pair of inductor ends.

4. An inductor damper circuit comprising:
a toroidal inductor having an inductor coil and an inductor housing; and
a resistive element on a flexible insulating disk at a base of the inductor coil and having one end connected to the toroidal inductor, wherein:
the resistive element is printed on a flexible substrate and configured between the inductor coil and the inductor housing;
the resistive element is integrated within the inductor housing with the toroidal inductor; and
the flexible substrate forms the flexible insulating disk disposed between a bottom of the inductor coil and a top surface of the inductor housing.

5. The inductor damper circuit of claim 4, wherein resistive element begins at a first point of a circumference of the flexible insulating disc and traverses a first half of the circumference in a first semi-circular zig-zag path, crosses to a second a second half of the circumference, and traverses the second half of the circumference in a second semi-circular zig-zag path, and ends proximally to the first point of the circumference, wherein the second semi-circular zig-zag path is a mirror of the first semi-circular zig-zag path.

6. The inductor damper circuit of claim 4, wherein the resistive element begins at a first point of the circumference of the flexible insulating disc and traverses an entire circumference of the insulating disc in a zig-zag path, wherein the resistive element ends proximal to the first point of the circumference.

7. The inductor damper circuit of claim 4, wherein the resistive element includes a pair of resistor ends terminating separately from a pair of inductor ends.

8. The inductor damper circuit of claim 4, wherein the resistive element includes a pair of resistor ends, where one resistor end from the pair of resistor ends is co-terminal with one inductor end of a pair of inductor ends.

9. An inductor damper circuit comprising:
a toroidal inductor having an inductor coil and an inductor housing; and
a resistive element configured around a periphery of the inductor coil and having one end connected to the toroidal inductor, wherein:
the resistive element is printed on a flexible substrate and electrically connected to the inductor coil; and
the resistive element is integrated within the inductor housing with the toroidal inductor;
wherein the flexible substrate forms a strip-type resistor having a resistive trace printed thereupon and is disposed between an outer periphery of the inductor coil and an inner periphery of the inductor housing; and
the flexible substrate forms a rectangle having a width and a length that is longer than the width, wherein the resistive trace begins at a first end of the substrate, and traverses along the width in a zig-zag pattern from the first end of the substrate to a second end of the substrate, wherein the resistive trace terminates at the first end of the substrate.

10. The inductor damper circuit of claim 9, wherein the resistive element includes a pair of resistor ends terminating separately from a pair of inductor ends.

11. The inductor damper circuit of claim 9, wherein the resistive element includes a pair of resistor ends, where one resistor end from the pair of resistor ends is co-terminal with one inductor end of a pair of inductor ends.

* * * * *